(12) United States Patent
Yagiura

(10) Patent No.: US 7,804,020 B2
(45) Date of Patent: Sep. 28, 2010

(54) PHOTOVOLTAIC MODULE

(75) Inventor: Toshio Yagiura, Kobe (JP)

(73) Assignee: Sanyo Electric Co., Ltd. (JP)

( * ) Notice: Subject to any disclaimer, the term of this patent is extended or adjusted under 35 U.S.C. 154(b) by 814 days.

(21) Appl. No.: 11/402,938

(22) Filed: Apr. 13, 2006

(65) Prior Publication Data

US 2006/0231134 A1 Oct. 19, 2006

(30) Foreign Application Priority Data

Apr. 15, 2005 (JP) ............................. 2005-117635
Apr. 28, 2005 (JP) ............................. 2005-130654

(51) Int. Cl.
*H02N 6/00* (2006.01)

(52) U.S. Cl. ................... 136/243; 136/251; 136/259

(58) Field of Classification Search ................ 136/243, 136/251, 259
See application file for complete search history.

(56) References Cited

U.S. PATENT DOCUMENTS 6,204,443 B1 * 3/2001 Kiso et al. .................. 136/259
6,462,266 B1 * 10/2002 Kurth ........................ 136/251
7,371,961 B2 * 5/2008 Hikosaka et al. ............ 136/251
2003/0079772 A1 * 5/2003 Gittings et al. .............. 136/251
2005/0000560 A1 * 1/2005 Shiotsuka et al. ........... 136/243
2005/0274410 A1 * 12/2005 Yuuki et al. ................. 136/251

FOREIGN PATENT DOCUMENTS

| JP | 2001-119056 | 4/2001 |
| JP | 2002-111036 | 4/2002 |
| JP | 2004-014791 | 1/2004 |
| JP | 2005-252117 | 9/2005 |

* cited by examiner

*Primary Examiner*—Jennifer K Michener
*Assistant Examiner*—Matthew T Martin
(74) *Attorney, Agent, or Firm*—NDQ&M Watchstone LLP

(57) ABSTRACT

A photovoltaic module includes a plurality of photovoltaic devices, a first filling material formed by a resin having a first soften temperature which is disposed in an area where the photovoltaic devices are disposed, a second filling material having a second soften temperature which is disposed in an area other than the area where the photovoltaic devices are disposed, a front surface protecting material disposed on the first filling material and the second filling material. The second soften temperature is higher than the first soften temperature.

12 Claims, 5 Drawing Sheets

PHOTOVOLTAIC MODULE

BACKGROUND OF THE INVENTION

1. Field of the Invention

The present invention relates to a photovoltaic module, and particularly relates to a photovoltaic module including a filling material.

2. Description of the Related Art

Conventionally, a photovoltaic module including a filling material has been known (for example, refer to Japanese Unexamined Patent Application Publication No. 2001-119056). This application discloses a solar battery module (photovoltaic module) using a sealing material (filling material) difficult to deform at high temperatures, in order to cover the front and side surfaces of a solar battery device (photovoltaic device) and to fix the solar battery device and a transparent front protecting material (front surface protecting material) disposed on the front surface of the solar battery device. In the solar battery module, since the sealing material difficult to deform at high temperatures is used, the sealing material can be prevented from deforming by the force laterally applied to the transparent front protecting material when the temperature of the sealing material is high. This allows the transparent front protecting material to be prevented from being laterally displaced relative to the solar battery device.

However, the sealing material, used in the solar battery module disclosed in the above-described application, is difficult to deform even at high temperatures. As a result, when the solar battery is reused or a broken solar battery device is replaced, the sealing material is difficult to be removed from the solar battery device by heating the sealing material to a high temperature for softening it. Thus, it is difficult to reuse the solar battery device or to replace the broken solar battery device.

Therefore, a photovoltaic module capable of separating the photovoltaic module from the filling material of a lower soften temperature has been proposed. FIG. 1 is a cross sectional view showing the structure of the conventionally proposed photovoltaic module including the filling material having a low soften temperature. Referring to FIG. 1, the structure of the conventionally proposed photovoltaic module 101 will be described.

The conventional photovoltaic module 101 includes a plurality of photovoltaic devices 102 as shown in FIG. 1. Each of the photovoltaic devices 102 is connected with another adjacent photovoltaic device 102 via a tab electrode 103 made of a copper foil. The front, back, and side surfaces of the plurality of the photovoltaic devices 102 are covered with the filling material 104 made of a thermoplastic resin not including a cross linker. A front surface protecting material 105 made of glass board is disposed on the front surface of the filling material 104. The filling material 104 fixes the front surface protecting material 105. A back surface protecting material 106 is disposed on the back surface of the filling material 104. Frame members 108 are mounted on the side surfaces of the front surface protecting material 105, filling material 104, and the back surface protecting material 106 via an bonding layers 107.

According to the conventional photovoltaic module 101, since the thermoplastic resin not including the cross linker is used as the filling material 104, the soften temperature of the filling material 104 is lowered as compared with, for example, the case that a thermosetting resin including the cross linker is used as the filling material 104. This makes it possible to easily remove the fling material 104 from the photovoltaic devices 102 by heating the filling material 104 and softening it, for the reuse of the photovoltaic device 102 and the replacement of the broken photovoltaic device 102. Thus, it is possible to reuse the photovoltaic device 102 and to replace the broken photovoltaic device 102.

According to the conventional photovoltaic module 101 shown in FIG. 1, since the thermoplastic resin not containing a cross linker is used as the filling material 104, the soften temperature of the filling material 104 is lowered as compared with, for example, the case that a thermosetting resin containing a cross linker is used as the filling material 104. However, there has been a problem that the filling material 104 is easily deformed when the temperature of the filling material 104 becomes equal to or more than the soften temperature of the filling material 104. Therefore, the front surface protecting material 105 tends to be displaced laterally (in direction A) relative to the photovoltaic device 102, when a lateral (in direction A) force is applied to the front surface protecting material 105 disposed on the front surface of the filling material 104 in the state that the filling material 104 is easily deformed.

SUMMARY OF THE INVENTION

The photovoltaic module according to an aspect of the present invention, the photovoltaic module includes: a plurality of photovoltaic devices; a first filling material formed by a resin having a first soften temperature which is disposed in an area where the photovoltaic devices are disposed and; a second filling material having a second soften temperature which is disposed in an area other than the area where the photovoltaic devices are disposed, the second soften temperature is higher than the first soften temperature; and a front surface protecting material disposed on the first filling material and the second filling material.

According to the aspect described above, the first filling material formed by the resin having the first soften temperature, is disposed in the area where the photovoltaic devices are disposed. And the second filling material having the second soften temperature higher than that of the first soften temperature, is disposed in the area other than the area where the photovoltaic devices are disposed. That is, the first filling material having lower soften temperature is disposed in the area where the photovoltaic devices are disposed so that the first filling material can easily be softened by elevating the temperature of the first filling material to the first soften temperature or higher. This allows the photovoltaic devices to easily be separated from the first filling material. Therefore, it is possible to reuse the photovoltaic device and to replace the broken photovoltaic device. Also, the second filling material having the second soften temperature higher than that of the first soften temperature of the first filling material is disposed in the area other than the area where the photovoltaic devices are disposed, and the front surface protecting material is disposed on the second filling material having the higher second soften temperature, whereby the second filling material can be prevented from deforming when the temperature of the photovoltaic module becomes high. This makes it possible to prevent the front surface protecting material from being laterally displaced relative to the photovoltaic device when a lateral force is applied to the front surface protecting material which is disposed on the front surface of the second filling material.

An aspect of the present invention according to above-described aspect, the first filling material is preferably formed by a thermoplastic resin not containing a cross linker.

An aspect of the present invention according to above-described aspects, the second filling material is preferably formed by a thermoplastic resin which contains a cross linker.

An aspect of the present invention according to above-described aspects, the second filling material is preferably formed by a thermosetting resin.

An aspect of the present invention according to above-described aspects, the photovoltaic module preferably further includes a back surface protecting material disposed on a back side of the first filling material and the second filling material. The second material extends from the back surface of the front surface protecting material to the front surface of the back surface protecting material.

An aspect of the present invention according to above-described aspects, the second filling material is preferably surrounds each of the photovoltaic devices.

An aspect of the present invention according to above-described aspects, the second filling material is preferably surrounds the area where the plurality of the photovoltaic devices are disposed.

DETAILED DESCRIPTION OF THE PREFERRED EMBODIMENTS

The embodiments of the present invention are hereinafter described according to drawings.

First Embodiment

Figure 1:
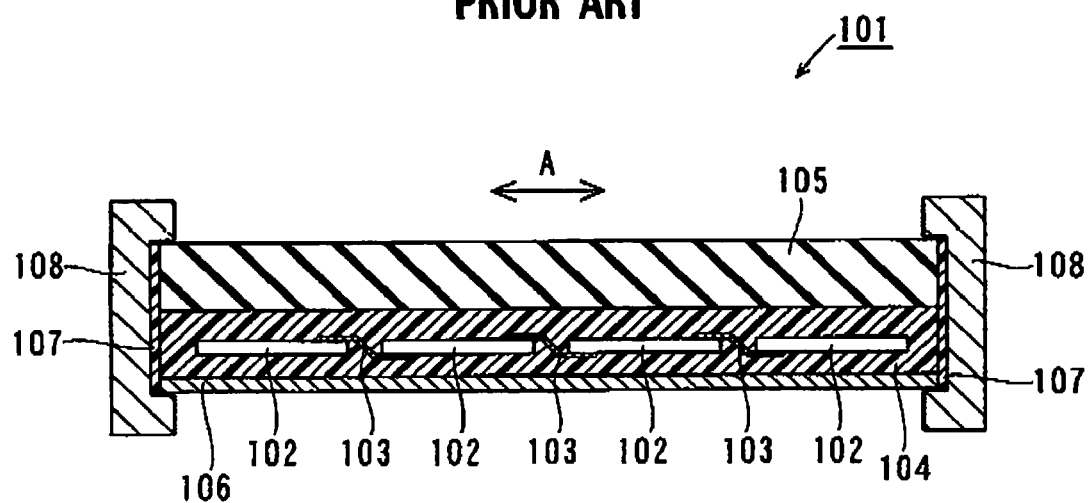
FIG. 1 is a cross-sectional view showing the structure of the photovoltaic device including a filling material according to a conventional example.
Figure 2:
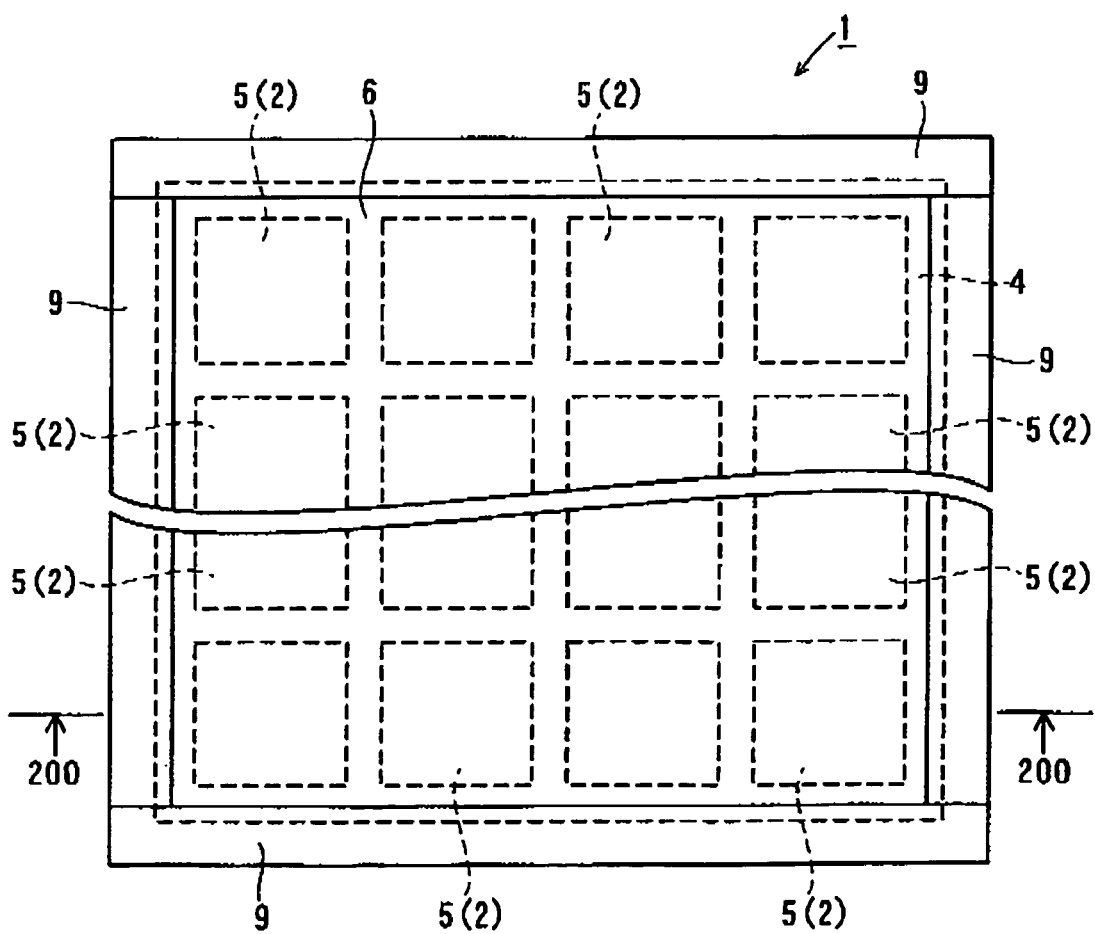
FIG. 2 is a plan view showing the structure of a photovoltaic module including a filling material according to a first embodiment of the present invention.
Figure 3:
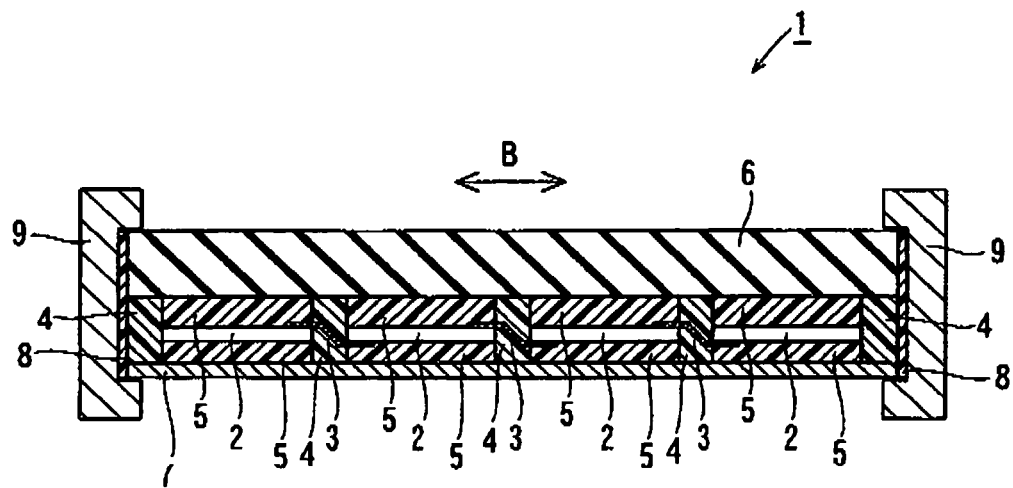
FIG. 3 is a cross-sectional view taken along a line 200-200 in FIG. 2.

FIG. 2 is a plan view showing the structure of a photovoltaic module, which includes a filling material according to the first embodiment of the present invention. FIG. 3 is a cross-sectional view taken along a line 200-200 in FIG. 2. Referring first to FIGS. 2 and 3, the structure of photovoltaic module 1 according to the first embodiment is described.

The photovoltaic module 1 according to the first embodiment of the present invention includes a plurality of photovoltaic devices 2 as shown in FIGS. 2 and 3. Each of the photovoltaic devices 2 is connected with another adjacent photovoltaic device 2 via a tab electrode 3 formed by a copper foil as shown in FIG. 3.

As shown in FIGS. 2 and 3, in the first embodiment, a transparent filling material 4 is disposed to surround each of the photovoltaic devices 2. The transparent filling material 4 has a high soften temperature (about 150° C. or higher), formed by thermoplastic EVA (Ethylene Vinyl Acetate) containing a cross linker. The front and back surfaces of the plurality of the photovoltaic devices 2 (Refer to FIG. 3) are covered with a filling material 5. The filling material 5 has a low soften temperature and formed by thermoplastic EVA not containing a cross linker. The filling material 4 is here an example of the second filling material according to the present invention, and the filling material 5 is an example of the first filling material according to the present invention. The filling material 5, formed by the thermoplastic EVA not containing a cross linker, has a lower soften temperature (about 60 to about 70° C.) than that of the filling material 4 (about 150° C. or higher) formed by the thermoplastic EVA containing a cross linker. That is to say, in the first embodiment, the filling material 5 having lower soften temperature is disposed in the areas where the plurality of the photovoltaic devices 2 are disposed, and the filling material 4 is disposed in the areas other than the areas where the photovoltaic devices 2 are disposed.

As shown in FIG. 3, a front surface protecting material 6 formed by a white tempered glass is disposed on the front surfaces of the filling material 4 and the filling material 5. The filling material 4 and the filling material 5 fix the front surface protecting material 6. The photovoltaic module 1 generates an electric power when the light passing through the front surface protecting material 6 reaches the photovoltaic device 2. In addition, a back surface protecting film 7 having a structure where an Al member is sandwiched by PVF (Polyvinyl Fluoride), is disposed on the back surfaces of the filling material 4 and the filling material 5. The PVF sandwiches the front and back surface of the Al member. The back surface protecting film 7 is an example of the back surface protecting material according to the present invention. The above filling material 4 having a high soften temperature is formed to extend from the back surface of the front surface protecting material 6 to the front surface of the back surface protection film 7. This formation allows the front surface protecting material 6 to be fixed to the back surface protecting film 7 via the filling material 4 having a high soften temperature. Furthermore, frame members 9 formed by Al are attached by bonding layers 8 containing butyl, so as to surround the front surface protecting material 6, the filling material 4, and the back surface protecting film 7.

As described above in the first embodiment, the filling material 5 having a lower soften temperature of about 60° C. to about 70° C. is disposed in the areas where the photovoltaic devices 2 are disposed. And the filling material 4 having a higher temperature (about 150° C.) than that of the filling material 5 is disposed in the area other than the areas where the photovoltaic devices are disposed. Therefore, the filling material 5 can easily be softened by heating it to its soften temperature or higher. This allows the photovoltaic devices 2 to easily be separated from the filling material 5, and thereby makes it easy to reuse the photovoltaic device 2 and to replace a broken photovoltaic device 2. Moreover, the filling material 4 having a high soften temperature (about 150° C.) than that of the filling material 5 (about 60° C. to 70° C.) is disposed in the area other the areas where the photovoltaic devices 2 are disposed. And the front surface protecting material 6 is disposed on the filling material 4 having high soften temperature. And thereby the filling material 4 can be prevented from deforming even when the temperature of the photovoltaic module 1 is elevated to a high temperature. This makes it possible to prevent the front surface protecting material 6 from being laterally (in direction B) displaced relative to the photovoltaic devices 2 when a lateral (in direction B) force is applied to the front surface protecting material 6 disposed on the front surface of the filling material 4.

Also, in the first embodiment, the filling material 4 formed by the thermoplastic EVA containing a cross linker is formed to continuously extend from the back surface of the front surface protecting material 6 to the front surface of the back surface protecting film 7. And thereby the back surface of the front surface protecting material 6 can be fixed to the front surface of the back surface protecting film 7 by the filling material 4 having a high soften temperature than that of the filling material 5. Thus, the front surface protecting material 6 can surely be prevented from being laterally (in direction B) displaced when a lateral (in direction B) force is applied to the front surface protecting material 6.

Furthermore, in the first embodiment, the filling material 4 is disposed so as to surround each of the photovoltaic devices 2, whereby the contact area between the filling material 4 and the front surface protecting material 6 can be increased. This results in an effective prevention of the front surface protecting material 6 from being laterally (in direction B) displaced.

Referring then to FIGS. 2 and 3, the process of manufacturing the photovoltaic module 1 according to the first embodiment of the present invention is described.

As shown in FIG. 3, a plurality of the photovoltaic devices 2, connected with each other via tab electrodes 3 formed by a copper foil, are first prepared. The plurality of the photovoltaic devices 2 are then disposed on the front surface of the back surface protecting film 7. As shown in FIGS. 2 and 3, in the first embodiment, the filling material 4 which has a high soften temperature and is formed by the thermoplastic EVA containing a cross linker is filled so as to surround each of the photovoltaic devices 2 (Refer to FIG. 3), and the filling material 5 which has a lower soften temperature and is formed by the thermoplastic EVA not containing a cross linker is filled on the front and back surfaces of the photovoltaic devices 2. The front surface protecting material 6 formed by white tempered glass is then disposed on the front surfaces of the filling material 4 and the filling material 6. After that, the integration from the back surface protecting film 7 to the front surface protecting material 6 is carried out at about 150° C. using a vacuum thermocompression laminator. Then, the filling material 4 having a high soften temperature is cross-linked by heating it at about 150° C. for about 30 minutes or longer using an oven. As shown in FIG. 3, the frame members 9 formed by Al are attached by the bonding layers 8 containing butyl, so as to surround the front surface protecting material 6, the filling material 4, and the back surface protecting film 7.

An experiment that was carried out to check the effects of the photovoltaic module 1 according to the above first embodiment is described.

An experiment was carried out to check whether the photovoltaic devices 2 can be separated from the filling material 5. In this checking experiment, the back surface protecting film 7 was first removed from the photovoltaic module 1 by cutting. The thermoplastic filling material 5 not containing a cross linker which is disposed on each of the back surfaces of the photovoltaic devices 2 was removed at about 100° C., whereby the photovoltaic devices 2 could be removed from the photovoltaic module 1. This is considered to be because the thermoplastic EVA not containing a cross linker and having a lower soften temperature (about 60° C. to about 70° C.) was used as the filling material 5 disposed on the back surface of the photovoltaic devices 2, whereby the filling material 5 could be softened at about 100° C.

An experiment was carried out to check whether the filling material 4 can be prevented from deforming at high temperatures. In this experiment, the photovoltaic module 1 was placed outdoor. At this time, the outdoor air temperature was about 30° C. or higher, and the temperature of the photovoltaic module 1 was 80° C. or higher. Then, a lateral (in direction B in FIG. 3) force was applied to the front surface of the front surface protecting material 6. Consequently, no displacement of the front surface protecting material 6 in direction B in FIG. 3 occurred. This is considered to be because the thermoplastic EVA containing a cross linker and having a high soften temperature (about 150° C.) was used as the filling material 4, whereby the filling material 4 could be prevented from being softened and deformed at about 80° C.

Second Embodiment

Figure 4:
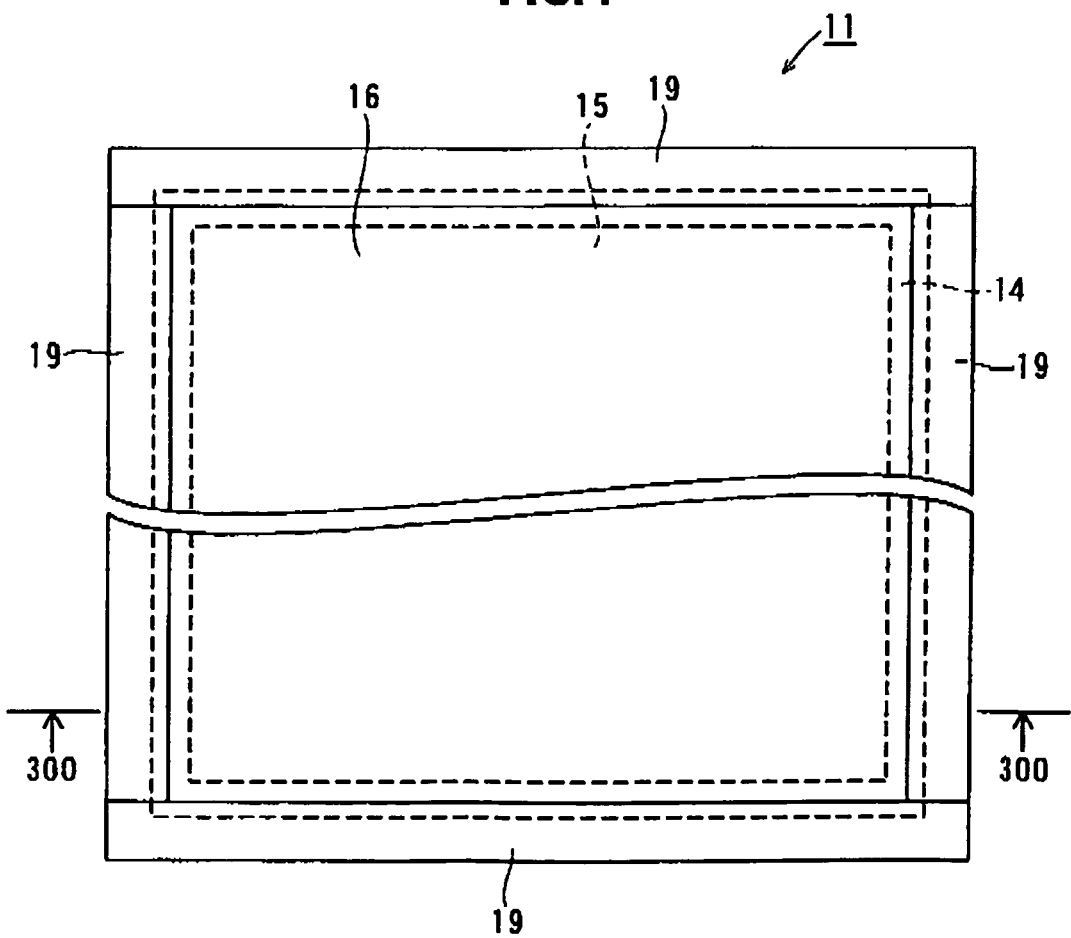
FIG. 4 is a plan view showing the structure of a photovoltaic module including a filling material according to a second embodiment of the present invention.
Figure 5:
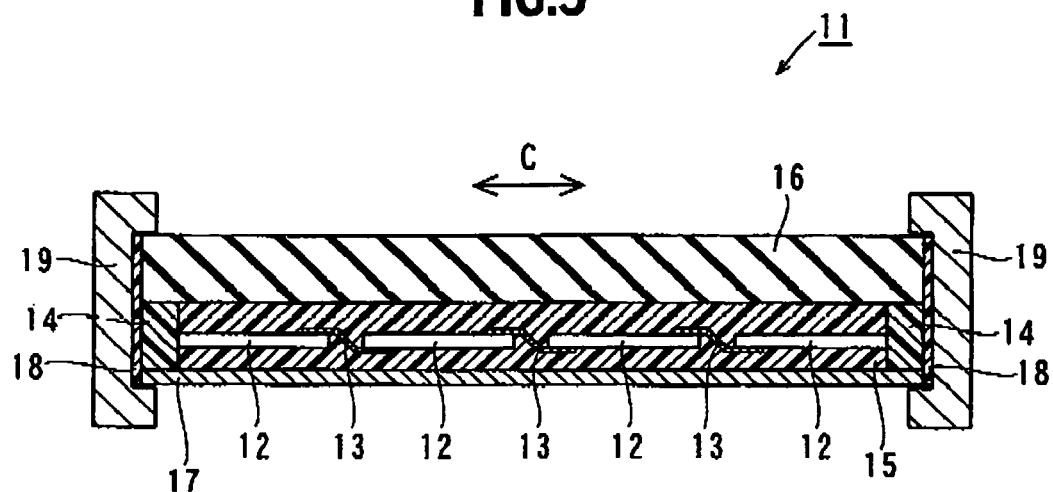
FIG. 5 is a cross-sectional view taken along a line 300-300 in FIG. 4.

FIG. 4 is a plan view showing the structure of the photovoltaic module including the filling material according to the second embodiment of the present invention. FIG. 5 is a cross-sectional view taken along a line 300-300 of the FIG. 4. Referring to FIGS. 4 and 5, in the second embodiment, an example is described where a filling material 14 having a high soften temperature is disposed only around the area where a plurality of photovoltaic devices 12 are disposed, different from the first embodiment described above.

As shown in FIG. 5, the photovoltaic module 11 according to the second embodiment includes a plurality of photovoltaic devices 12. Each of the photovoltaic devices 12 is connected with another adjacent photovoltaic device 12 via a tab electrode 13 formed by a copper foil.

As shown in FIGS. 4 and 5, in the second embodiment, a transparent filling material 14, which has a high soften temperature (about 150° C. or higher) and which is formed by the thermoplastic EVA containing a cross linker, is disposed so as to surround the area where the plurality of the photovoltaic devices 12 are disposed (Refer to FIG. 5). In addition, a filling material 15, which has a low soften temperature and which is formed by the thermoplastic EVA not containing a cross linker, is disposed on the front and back surfaces of the photovoltaic devices 12 (Refer to FIG. 3) and in the gaps between the photovoltaic devices adjacent to each other. The filling material 14 is an example of the second filling material according to the present invention, and the filling material 15 is an example of the first filling material according to the present invention. The filling material 15 formed by the thermoplastic EVA not containing a cross linker has a lower soften temperature (about 60° C. to about 70° C.) than that of the filling material 14 (about 150° C. or higher) formed by the thermoplastic EVA containing a cross linker. Also in the second embodiment, the filling material 15 having a low soften temperature is disposed in the area where a plurality of the photovoltaic devices 12 are disposed, and the filling material 14 having a high soften temperature is disposed in the area other than the area where the photovoltaic devices 12 are disposed.

As shown in FIG. 5, a front surface protecting material 16 formed by a white tempered glass is mounted on the front surface of the filling material 14 and the filling material 15. The filling material 14 and the filling material 15 fix the front surface protecting material 16. The photovoltaic module 11 generates an electric power when the light passing through the front surface protecting material 16 reaches the photovoltaic device 12. A back surface protecting film 17 having the structure where an Al member sandwiched by PVF is disposed on the back surface of the filling material 14 and the filling material 15. The PVF sandwiches the front and back surfaces of the Al member. The back surface protecting film 17 is an example of the back surface protecting material according to the present invention. The above filling material 14 having a high soften temperature is formed to extend from the back surface of the front surface protecting material 10 to the front surface of the back surface protecting film 17. This formation allows the front surface protecting material 16 to be fixed to the back surface protecting film via the filling material 14 having a high soften temperature. In addition, frame members 19 formed by Al are attached by bonding layers 18 containing butyl, so as to surround the front surface protecting material 16, the filling material 14, and the back surface protecting film 17.

In the second embodiment, the filling material 15 having a low soften temperature is disposed so as to fill the entire area where the plurality of the photovoltaic devices 12 are disposed, and the filling material 14 having a high soften temperature is disposed only around the area where the plurality of the photovoltaic devices 12 are disposed. As compared with the first embodiment where the filling material 4 having a high soften temperature is disposed to surround each of the photovoltaic devices 2, in the second embodiment, there is no need to dispose the filling material 14 having a high soften temperature in gaps between photovoltaic devices 12 adjacent to each other, after filling the filling material 15 having a low soften temperature. Therefore, it is possible to simplify a process of disposing the filling material 14 having a high soften temperature.

As in the case of the first embodiment, in the second embodiment, the filling material 15 having a low soften temperature of about 60° C. to about 70° C. is disposed in the area where photovoltaic devices 12 are disposed, and the filling material 14 having a high soften temperature (about 150° C.) than that of the filling material 15 is disposed in the area other than the area where the photovoltaic devices 12 are disposed. This allows the filling material 15 to be easily softened by heating it to the soften temperature thereof or higher because the filling material 15 having a low soften temperature of about 60° C. to about 70° C. is disposed in the area where the photovoltaic devices 12 are disposed. This allows the photovoltaic devices 12 to easily be separated from the filling material 16, and thereby makes it easy to reuse the photovoltaic devices 12 and to replace a broken photovoltaic device 12. Moreover, the filling material 14 having a high soften temperature (about 150° C.) than that (about 60° C. to 70° C.) of the filling material 15 is disposed in the area other than the area where the photovoltaic devices 12 are disposed, and the front surface protecting material 16 is disposed on the filling material 14 having high soften temperature, whereby the filling material 14 can be prevented from deforming when the temperature of the photovoltaic module 11 is elevated to a high temperature. This makes it possible to prevent the front surface protecting material 16 from being laterally (in direction C) displaced relative to the photovoltaic devices 12 when a lateral (in direction C) force is applied to the front surface protecting material 16 disposed on the front surface of the filling material 14.

The advantages of the second embodiment are the same as those of the first embodiment.

Referring then to FIGS. 4 and 5, the process of manufacturing the photovoltaic module 11 according to the second embodiment of the present invention is described.

As shown in FIG. 5, the plurality of the photovoltaic devices 12, connected with each other via the tab electrodes 13 formed by a copper foil, are first prepared. The plurality of the photovoltaic devices 12 are disposed on the front surface of the back surface protecting film 17. As shown in FIGS. 4 and 5, in the second embodiment, the filling material 14 which has a high soften temperature and is formed by the thermoplastic EVA containing a cross linker is filled so as to surround the area where the photovoltaic devices 12 (Refer to FIG. 5) are disposed, and the filling material 15 which has a lower soften temperature and is formed by the thermoplastic EVA not containing a cross linker is filled in the area where the plurality of the photovoltaic devices 12 are disposed. The front surface protecting material 16 formed by white tempered glass is disposed on the front surfaces of the filling material 14 and the filling material 15. After that, the integration between the back surface protecting film 17 and the front surface protecting material 16 is carried out at about 150° C. using a vacuum thermocompression laminator. Then, the filling material 14 having a high soften temperature is cross-linked by heating it at about 150° C. for about 30 minutes or longer using an oven. As shown in FIG. 5, the frame members 19 formed by Al are attached by the bonding layers 18 containing butyl, so as to surround the front surface protecting material 16, the filling material 14, and the back surface protecting film 17.

Third Embodiment

Figure 6:
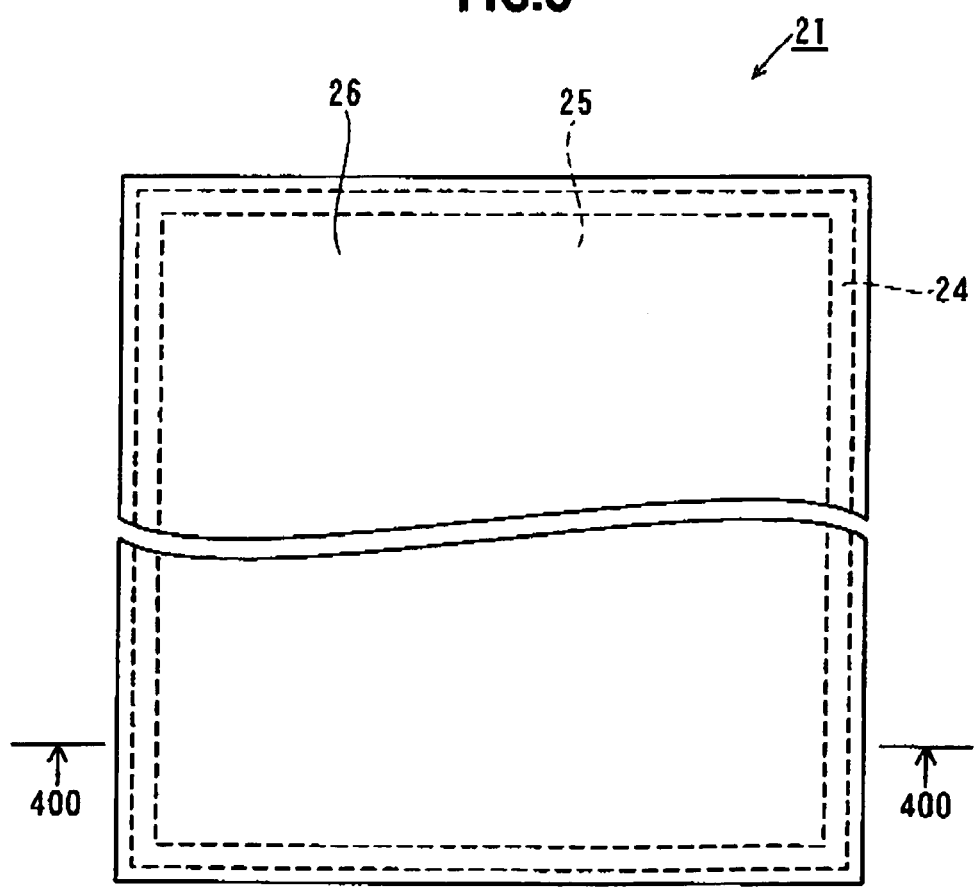
FIG. 6 is a plan view showing the structure of a thin-film photovoltaic module including a filling material according to a third embodiment of the present invention.
Figure 7:
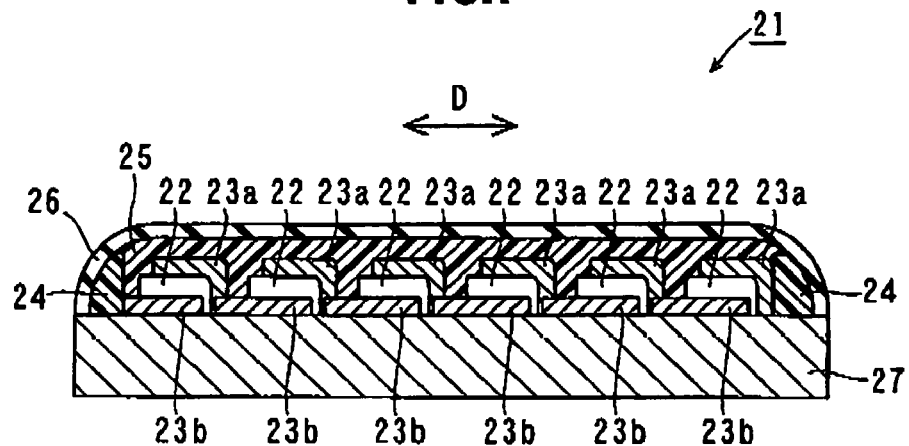
FIG. 7 is a cross-sectional view taken along a line 400-400 in FIG. 6.

FIG. 6 is a plan view showing the structure of the photovoltaic module including the filling material according to the third embodiment of the present invention. FIG. 7 is a cross-sectional view taken along a line 400-400 of FIG. 6. Referring first to FIGS. 6 and 7, in the third embodiment, an example is described where the present invention is applied to a photovoltaic module 21 including a photovoltaic device 22 having a structure different from that of the photovoltaic devices of the first and second embodiments above.

As shown in FIG. 7, the photovoltaic module 21 according to the third embodiment includes a plurality of the photovoltaic devices 22 each of which includes a thin amorphous silicon layer. A transparent electrode 23a is formed in a predetermined area on the front surface of each photovoltaic device 22. A back surface electrode 23b is formed in the predetermined area on the back surface of each photovoltaic device 22, and connected with the transparent electrode 23a of the adjacent photovoltaic device 22. This allows the plurality of the photovoltaic devices 22 to be connected with another adjacent photovoltaic devices 22.

As shown in FIGS. 6 and 7, in the third embodiment, a transparent filling material 24, which has a high soften temperature (about 150° C. or higher) and which is formed by the thermoplastic EVA containing a cross linker, is disposed to surround the area where the plurality of the photovoltaic devices 22 are disposed (Refer to FIG. 7). In addition, as shown in FIG. 7, a filling material 25 which has a low soften temperature and is formed by the thermoplastic EVA not containing a cross linker is disposed on the front surfaces of the pluralities of photovoltaic devices 22, the transparent electrodes 23a, and the back surface electrodes 23b. The filling material 24 is an example of the second filling material according to the present invention, and the filling material 25 is an example of the first filling material according to the present invention. The filling material 25 formed by the thermoplastic EVA not containing a cross linker has a lower soften temperature (about 60° C. to about 70° C.) than that of the filling material 24 (about 150° C.) formed by the thermoplastic EVA containing a cross linker. Also in this third embodiment, the filling material 25 having a low soften temperature is also disposed in the area where the plurality of the photovoltaic devices 22 is disposed, and the filling material 24 having a high soften temperature is disposed in the area other than the area where the photovoltaic devices 22 are disposed.

Furthermore, a transparent surface protecting film 26 formed by an ETFE (Ethylene Tetrafluoroethylene copolymer) is mounted on the front surface of the filling material 24 and the filling material 25. The front surface protecting film 26 is an example of the front surface protecting material according to the present invention. The filling material 24 and the filling material 25 fix the front surface protecting film 26. The photovoltaic module 21 generates an electric power when the light passing through the front surface protecting film 26 reaches the photovoltaic devices 22. A back surface protecting material 27 formed by a metal is disposed on the back surfaces of the filling material 24, the photovoltaic devices 22, and the back surface electrodes 23b.

As in the cases of the first and second embodiments, in the third embodiment, the filling material 25 having a low soften temperature of about 60° C. to about 70° C. is disposed in the area where photovoltaic devices 22 are disposed, and the filling material 24 having a high soften temperature (about 150° C.) than that of the filling material 25 is disposed in the area other than the area where the photovoltaic devices 22 are disposed. This allows the filling material 25 to be easily softened by heating it to the soften temperature thereof or higher because the filling material 25 having a low soften temperature of about 60° C. to about 70° C. is disposed in the area where the photovoltaic devices 22 are disposed. This allows the photovoltaic devices 22 to be easily separated from the filling material 25, and thereby makes it easy to reuse the photovoltaic devices 22 and to replace a broken photovoltaic device 22. Moreover, the filling material 24 having a high soften temperature (about 150° C.) than that (about 60° C. to 70° C.) of the filling material 25 is disposed in the area other than the area where the photovoltaic devices 22 are disposed, and the front surface protecting film 26 is disposed on the filling material 24 having a high soften temperature, whereby the filling material 24 can be prevented from deforming when the temperature of the photovoltaic module 21 is elevated to a high temperature. This makes it possible to prevent the front surface protecting film 26 from being laterally (in direction D) displaced relative to the photovoltaic devices 22 when a lateral (in direction D) force is applied to the front surface protecting film 26 disposed on the front surface of the filling material 24.

The advantages of the third embodiment are the same as those of the second embodiment.

Referring then to FIGS. 6 and 7, the process of manufacturing the photovoltaic module 21 according to the third embodiment of the present invention is described.

As shown in FIG. 7, a metallic back surface protecting material 27 on which the pluralities of the back surface electrodes 23b, the photovoltaic devices 22, and the transparent electrodes 23a are formed is first prepared. Then, the filling material 24 which has a high soften temperature and is formed by the thermoplastic EVA containing a cross linker is filled so as to surround the area where the plurality of the photovoltaic devices 22 are disposed. And the filling material 25 which has a low soften temperature and is formed by the thermoplastic EVA not containing a cross linker is filled on the front surfaces of the photovoltaic devices 22, the transparent electrodes 23a, and the back surface electrodes 23b. As shown in FIGS. 6 and 7, the front surface protecting film 26 formed by the ETFE is disposed on the front surface of the filling material 24 and the filling material 25. After that, the integration from the back surface protecting film 27 (Refer to FIG. 7) to the front surface protecting material 26 is carried out at about 150° C. using a vacuum thermocompression laminator. Then, the filling material 24 having a high soften temperature is cross-linked by heating it at about 150° C. for about 30 minutes or longer using an oven.

The embodiments herein disclosed should be considered to be exemplifications with all respects and not limitative. The scope of the present invention is shown not by the description of the embodiments above but by the claims, and further includes the meanings equivalent to the claims and all modifications within the scope.

For example, the embodiments above describe an example using a thermoplastic EVA which does not contain a cross linker as a filling material having a low soften temperature. However, the present invention does not limit the filling material having a low soften temperature to this example. The filling material having a low soften temperature may be ethylene resins including an EEA (Ethylene Ethylacrylate) and thermoplastic resins including PVB (Poly Vinyl Butyral) and urethane.

The embodiments above describe an example using the thermoplastic EVA containing a cross linker as a filling material having a high soften temperature. However, the present invention does not limit the filling material having a high soften temperature to this example. The filling material having a high soften temperature may be thermosetting resins including acryl, silicone, or epoxy, and thermoplastic resins other than the EVA containing a cross linker.

Figure 8:
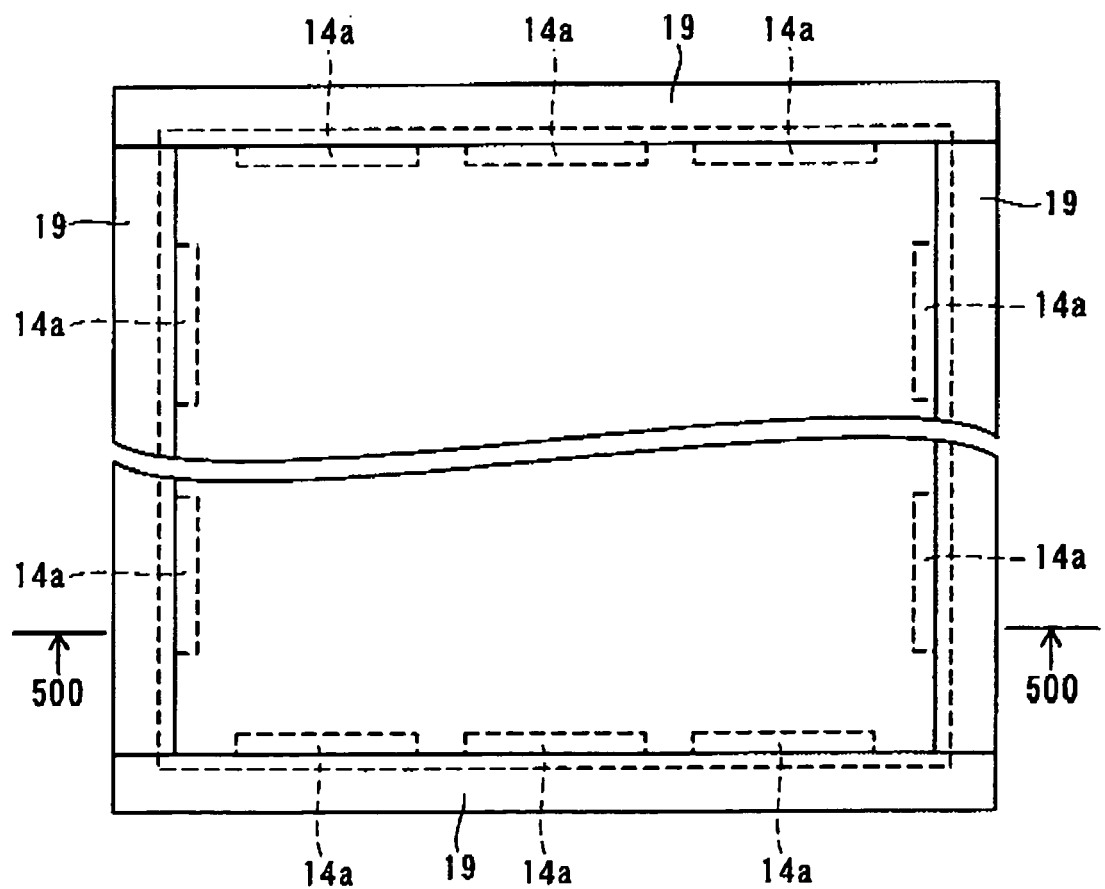
FIG. 8 is a plan view showing the structure of a photovoltaic module including a filling material according to a first modification example of the second embodiment of the present invention.
Figure 9:
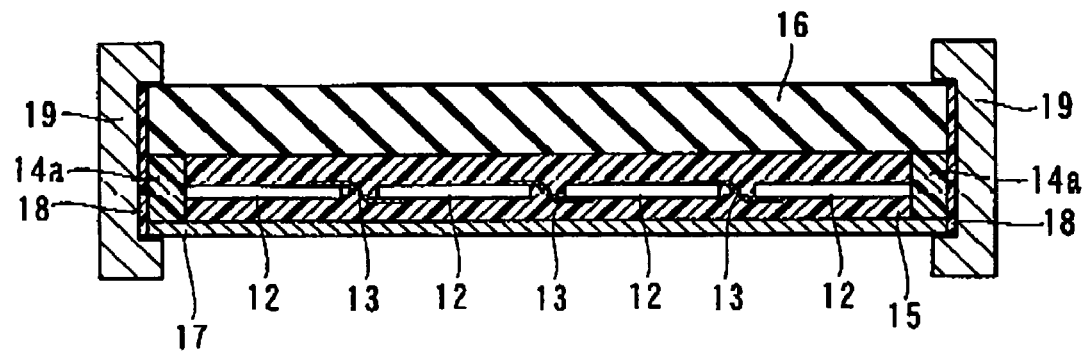
FIG. 9 is a cross-sectional view taken along a line 500-500 in FIG. 8.

In the second and third embodiments, an example is described where a thermoplastic filling material containing a cross linker is disposed so as to surround the entire area where the plurality of the photovoltaic devices are disposed. However, the present invention does not limit the manner of disposing the filling material to this example. The manner of disposing the filling material may be a manner of disposing a thermoplastic filling material 14a containing a cross linker partly around the area where a plurality of the photovoltaic devices 12 are disposed (Refer to FIG. 9) as in the case of the first modification example of the second embodiment shown in FIGS. 8 and 9.

Figure 10:
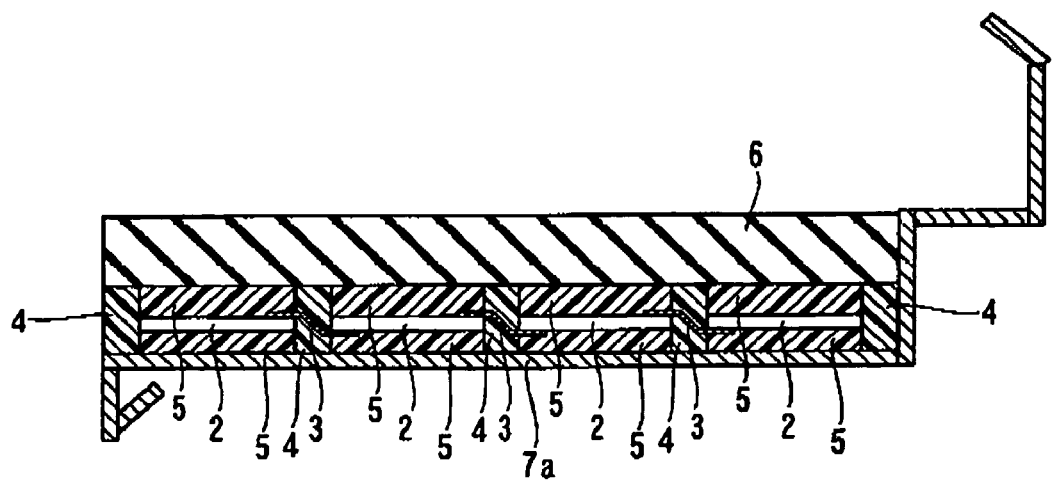
FIG. 10 is a plan view showing the structure of a photovoltaic module including a filling material according to a second modification example of the present invention.

The first and second embodiments describe an example where the photovoltaic module is formed by sandwiching the photovoltaic device between the front surface protecting material and the back surface protecting film on the front and back sides thereof, respectively. However, the present invention does not limit the formation of the photovoltaic module to this example. Specifically, as shown in FIG. 10 illustrating a second modification example, the photovoltaic module may be formed by sandwiching the front and back sides of the photovoltaic device with the front protecting material 6 and building material 7a. In this case, a galbarium steel plate can be used as the building material 7a. The galbarium steel plate is a steel plate which is plated by an aluminum-zinc alloy formed by aluminum (about 55% by mass), ring (about 43.4% by mass), and silicon (about 1.6% by mass).

The third embodiment above describes an example where a metallic member is used as the back surface protecting material. However, the present invention does not limit the back surface material to this example. The back surface protecting material may be a glass member. In this case, if a transparent back surface electrode is mounted in a predetermined area on the back surface of each photovoltaic device, an electric power can be generated by making the light enter from the back surface protecting material side.

The third embodiment above describes an example where a front surface protecting film formed by ETFE is used as the front surface protecting material. However, the present invention does not limit the front surface protecting material to this example. The front surface protecting material may be a front surface protecting film formed by other fluorine resins than ETFE including PVDF (Poly Vinylidene Fluoride), PCTFE (Polychlorotrifluoroethylene) and PVF, and of other resins including PET (Poly Ethylene Terephthalate), PC (Polycarbonate) and Acryl, and using glass such as a white tempered glass.

The first and second embodiments above describe an example where the back surface protecting film formed by sandwiching Al member between PVF is used as the back surface protecting material. However, the present invention does not limit the back surface protecting material to this example. The back surface protecting material may be metals including SUS and galbarium steel plate, fluorine resins including PET, ETFE, PVDF, and PCTFE, PC or glass, and also may be a member formed by sandwiching a metallic foil between those mentioned above.

The first and second embodiments above describe an example where a member formed by Al is used as the frame member. However, the present invention does not limit the material of the frame member to this example. The frame member may be metals including iron and SUS. Also, the photovoltaic module is not necessary to include the frame member.

What is claimed is:

1. A photovoltaic module comprising;
    a plurality of photovoltaic devices;
    a first filling material comprising a resin having a first soften temperature;
    a second filling material comprising a resin having a second soften temperature higher than the first soften temperature; and
    a front surface protecting material,
    wherein the first filling material is disposed at least on and in contact with front and back surfaces of the photovoltaic devices,
the front surface protecting material is disposed on and in contact with each of the first filling material and the second filling material, and
one or more sides of a photovoltaic device of said plurality maintains contact with the second filling material, wherein the second filling material does not exist above and below the photovoltaic cell.

2. The photovoltaic module according to claim 1, wherein the first filling material is formed by a thermoplastic resin not containing a cross linker.

3. The photovoltaic module according to claim 1, wherein the second filling material is formed by a thermoplastic resin containing a cross linker.

4. The photovoltaic module according to claim 1, wherein the second filling material is formed by a thermosetting resin.

5. The photovoltaic module according to claim 1, further comprising:
    a back surface protecting material disposed on a back side of the first filling material and the second filling material,
    wherein,
    the second filling material extends from a back surface of the front surface protecting material to a front surface of the back surface protecting material.

6. The photovoltaic module according to claim 1, wherein the second filling material surrounds each of the photovoltaic devices.

7. The photovoltaic module according to claim 1, wherein the second filling material surrounds the area where the plurality of photovoltaic devices are disposed.

8. A photovoltaic module comprising;
    a plurality of photovoltaic devices;
    a first filling material comprising a resin having a first soften temperature;
    a second filling material comprising a resin having a second soften temperature higher than the first soften temperature; and,
    front and back surface protecting materials,
    wherein, the first filling material and the second filling material are disposed between a back surface of the front surface protecting material and a front surface of the back surface protecting material, the second filling material extending from the back surface of the front surface protecting material to the front surface of the back surface protecting material, each of the plurality of photovoltaic devices disposed between a front layer and a back layer of the first filling material, the front layer contacting the front surface protecting material and the back layer contacting the back surface protecting material, and one or more sides of a photovoltaic device of said plurality of photovoltaic devices maintains contact with the second filling material, wherein the second filling material does not exist above and below the photovoltaic cell.

9. The photovoltaic module of claim 8, wherein the second filling material defines at least one cell by extending from the back surface of the front surface protecting material to the front surface of the back surface protecting material on a plurality of sides of the photovoltaic device.

10. The photovoltaic module of claim 9, wherein the at least one cell comprises a photovoltaic device disposed therein.

11. The photovoltaic device of claim 10 wherein the photovoltaic device is disposed between a front layer and a back layer of the first filling material, the front layer contacting the front surface protecting material and the back layer contacting the back surface protecting material.

12. The photovoltaic module of claim 10, wherein the second filling material forms a square grid pattern.

* * * * *